(12) United States Patent
Asahi et al.

(10) Patent No.: US 11,655,159 B2
(45) Date of Patent: May 23, 2023

(54) DIELECTRIC FILM, DIELECTRIC ELEMENT, AND ELECTRONIC CIRCUIT BOARD

(71) Applicant: TDK CORPORATION, Tokyo (JP)

(72) Inventors: Toshio Asahi, Tokyo (JP); Masamitsu Haemori, Tokyo (JP); Hitoshi Saita, Tokyo (JP)

(73) Assignee: TDK CORPORATION, Tokyo (JP)

( * ) Notice: Subject to any disclaimer, the term of this patent is extended or adjusted under 35 U.S.C. 154(b) by 449 days.

(21) Appl. No.: 17/071,474

(22) Filed: Oct. 15, 2020

(65) Prior Publication Data

US 2021/0130187 A1    May 6, 2021

(30) Foreign Application Priority Data

Oct. 31, 2019    (JP) .............................. JP2019-199391

(51) Int. Cl.
| | |
|---|---|
| *C04B 35/465* | (2006.01) |
| *C04B 35/47* | (2006.01) |
| *H01G 4/10* | (2006.01) |
| *H01G 4/12* | (2006.01) |
| *C01G 23/00* | (2006.01) |
| *C23C 16/40* | (2006.01) |
| *C23C 16/06* | (2006.01) |
| *C23C 16/56* | (2006.01) |
| *H01G 4/33* | (2006.01) |
| *H05K 1/18* | (2006.01) |

(52) U.S. Cl.
CPC ............ *C01G 23/006* (2013.01); *C23C 16/06* (2013.01); *C23C 16/409* (2013.01); *C23C 16/56* (2013.01); *H01G 4/10* (2013.01); *H01G 4/33* (2013.01); *H05K 1/185* (2013.01); *C01P 2002/52* (2013.01); *C01P 2002/72* (2013.01); *C01P 2002/74* (2013.01); *C01P 2006/40* (2013.01); *H05K 2201/10015* (2013.01)

(58) Field of Classification Search
CPC ........................... C04B 35/465; H01G 4/1227
See application file for complete search history.

(56) References Cited

U.S. PATENT DOCUMENTS

| | | | |
|---|---|---|---|
| 8,178,456 B2 * | 5/2012 | Burn ................. | C04B 35/62815 501/136 |
| 2004/0220043 A1 * | 11/2004 | Fukui ................... | H01G 4/1227 501/136 |
| 2010/0008019 A1 * | 1/2010 | Burn ..................... | C04B 35/465 501/136 |

FOREIGN PATENT DOCUMENTS

JP    2007-179794 A    7/2007

* cited by examiner

*Primary Examiner* — Karl E Group
(74) *Attorney, Agent, or Firm* — Oliff PLC (57) ABSTRACT

A dielectric film includes a main component of a complex oxide represented by a general formula of $(Sr_{1-x}Ca_x)_y TiO_3$. $0.40 \leq x \leq 0.90$ and $0.90 \leq y \leq 1.10$ are satisfied. A ratio of a diffraction peak intensity on (1, 1, 2) plane of the complex oxide to a diffraction peak intensity on (0, 0, 4) plane of the complex oxide in an X-ray diffraction chart of the dielectric film is 3.00 or more. Instead, a ratio of an intensity of a diffraction peak appearing at a diffraction angle 2θ of 32° or more and 34° or less to an intensity of a diffraction peak appearing at a diffraction angle 2θ of 46° or more and 48° or less in an X-ray diffraction chart of the dielectric film obtained by an X-ray diffraction measurement with Cu-Kα ray as an X-ray source is 3.00 or more.

14 Claims, 2 Drawing Sheets

DIELECTRIC FILM, DIELECTRIC ELEMENT, AND ELECTRONIC CIRCUIT BOARD

BACKGROUND OF THE INVENTION

The present invention relates to a dielectric film, a dielectric element, and an electronic circuit board.

In recent years, along with the miniaturization and high performance of electronic devices, the density and integration of electronic circuits have been increasing. Further miniaturization is also desired for dielectric elements, such as capacitor elements mounted in large numbers on such electronic circuits.

On the other hand, the clock rise time becomes shorter as the operating frequency of the electronic circuits becomes higher. Furthermore, the voltage of the power supply is being reduced for lower power consumption of the electronic devices. In such conditions, when the load of the electronic circuits changes abruptly, the drive voltage of the electronic circuits tends to be unstable. For normal operation of the electronic circuits, the drive voltage needs to be stabilized.

For such a purpose, employed is a method of disposing a decoupling capacitor between a voltage power supply line and a ground line of the electronic circuits to stabilize the drive voltage. For effectively functioning the decoupling capacitor, it is necessary to reduce the equivalent series inductance between the electronic circuit and the decoupling capacitor and to increase the capacity of the decoupling capacitor itself.

For reduction of the equivalent series inductance between the electronic circuit and the decoupling capacitor, it is effective to dispose the decoupling capacitor as close to the electronic circuit as possible and achieve low inductance of the wiring between the electronic circuit and the decoupling capacitor.

As the decoupling capacitor, a thin film capacitor has been used from the viewpoint of design freedom. The materials used for dielectric substance of a thin film capacitor element are conventionally $SiO_2$, $Si_3N_4$, etc. However, there is a problem with low relative permittivity of these materials. Examples of materials having a comparatively high relative permittivity include perovskite-type oxides, such as (Ba, Sr)$TiO_3$, $BaTiO_3$, and $SrTiO_3$. To obtain a thin film capacitor having a large capacity, there is a method of thinning the dielectric in addition to a method of using a material having a high relative permittivity. When the dielectric is thinned, however, the leak characteristics deteriorate.

As a thin film capacitor having good leak characteristics, Patent Document 1 discloses a thin film dielectric containing strontium calcium titanate with a composition formula of $(Sr_{1-x}Ca_x)_yTiO_3$ and having an atomic number ratio "x" and "y" in a predetermined range.

Patent Document 1: JP2007179794 (A)

BRIEF SUMMARY OF INVENTION

However, there is a problem that a thin film capacitor with the thin film dielectric disclosed by Patent Document 1 has a low relative permittivity and a high leakage current density in a high electric field strength. In addition, there is a problem with a low allowable ripple current.

The present invention has been achieved under such circumstances. It is an object of the invention to provide a dielectric film with high relative permittivity, low leakage current density, and high allowable ripple current.

To achieve the above object, an embodiment of the present invention is:

[1] a dielectric film including a main component of a complex oxide represented by a general formula of $(Sr_{1-x}Ca_x)_yTiO_3$, wherein $0.40 \leq x \leq 0.90$ and $0.90 \leq y \leq 1.10$ are satisfied, and a ratio of a diffraction peak intensity on (1, 1, 2) plane of the complex oxide to a diffraction peak intensity on (0, 0, 4) plane of the complex oxide in an X-ray diffraction chart of the dielectric film is 3.00 or more.

[2] The dielectric film according to [1], wherein the ratio of the diffraction peak intensity on (1, 1, 2) plane of the complex oxide to the diffraction peak intensity on (0, 0, 4) plane of the complex oxide is 5.00 or more.

[3] A dielectric film including a main component of a complex oxide represented by a general formula of $(Sr_{1-x}Ca_x)_yTiO_3$, wherein $0.40 \leq x \leq 0.90$ and $0.90 \leq y \leq 1.10$ are satisfied, and a ratio of an intensity of a diffraction peak appearing at a diffraction angle $2\theta$ of 32° or more and 34° or less to an intensity of a diffraction peak appearing at a diffraction angle $2\theta$ of 46° or more and 48° or less in an X-ray diffraction chart of the dielectric film obtained by an X-ray diffraction measurement with Cu-K$\alpha$ ray as an X-ray source is 3.00 or more.

[4] The dielectric film according to [3], wherein the ratio of the intensity of the diffraction peak appearing at the diffraction angle $2\theta$ of 32° or more and 34° or less to the intensity of the diffraction peak appearing at the diffraction angle $2\theta$ of 46° or more and 48° or less is 5.00 or more.

[5] The dielectric film according to any of [1]-[4], further including at least one selected from the group of consisting of MnO, $V_2O_5$, $Al_2O_3$, and $Nb_2O_5$ as a subcomponent.

[6] The dielectric film according to [5], including MnO, wherein an amount of MnO with respect to 100 mol of the complex oxide is 0.010 mol or more and 2.000 mol or less.

[7] The dielectric film according to [5] or [6], including $V_2O_5$, wherein an amount of $V_2O_5$ with respect to 100 mol of the complex oxide is 0.050 mol or more and 3.000 mol or less.

[8] A dielectric element including the dielectric film according to any of [1]-[7] and an electrode.

[9] An electronic circuit board including the dielectric element according to [8].

Effects of the Invention

The present invention can provide a dielectric film with high relative permittivity, low leakage current density, and high allowable ripple current.

DETAILED DESCRIPTION OF INVENTION

Hereinafter, the present invention is explained in detail in the following order based on a specific embodiment.

Figure 1:
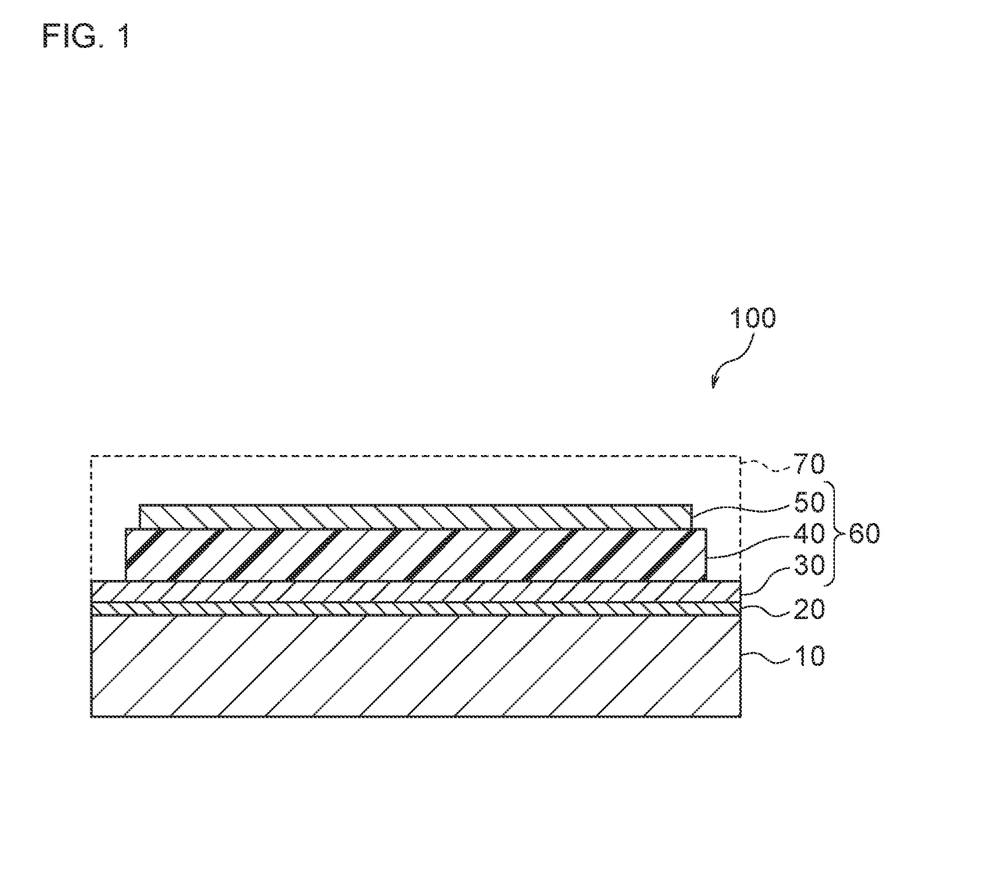
FIG. 1 is a schematic cross-sectional view of a thin film capacitor as an example of a dielectric element according to the present embodiment.

1. Thin Film Capacitor
   1.1 Overall Structure of Thin Film Capacitor
   1.2 Dielectric Film
   1.2.1 Complex Oxide
   1.3. Substrate
   1.4 First Electrode
   1.5. Second Electrode
2. Method of Manufacturing Thin Film Capacitor
3. Electronic Circuit Board
4. Summary of Present Embodiment
5. Modified Examples 1. Thin Film Capacitor First of all, a thin film capacitor including a thin dielectric film is explained as a dielectric element according to the present embodiment.
(1.1 Overall Structure of Thin Film Capacitor)
As shown in FIG. 1, a thin film capacitor 100 as an example of a dielectric element according to the present embodiment is structured by laminating a substrate 10, a first electrode 30, a dielectric film 40, and a second electrode 50 in this order. When the first electrode 30 and the second electrode 50 are connected to an external circuit and applied with voltage, the dielectric film 40 exhibits a predetermined capacitance and can function as a capacitor. The detailed explanation of each component is mentioned below. Incidentally, when the first electrode and the second electrode are made of different materials, either of the electrodes may be an upper electrode, and the other electrode may be a lower electrode, for distinguishment of the vertical direction of the thin film capacitor.

Incidentally, the thin film capacitor may have any shape, but normally has a rectangular parallelepiped shape. In addition, the thin film capacitor may have any size and has appropriate thickness and length based on usage.
(1.2 Dielectric Film)
The dielectric film 40 has a main component of a complex oxide mentioned below. In the present embodiment, the complex oxide accounts 95 mol % or more (preferably, 97 mol % or more) of the dielectric film (100 mol %).

In the present embodiment, the dielectric film 40 is a thin film formed by a known film formation method. Since such a thin film is normally formed by depositing atoms on a substrate, the dielectric film is preferably a dielectric deposition film. Thus, the dielectric film according to the present embodiment does not include a sintered body obtained by firing a pressed body formed by pressing a raw material powder of dielectric substance (obtained by solid-phase reaction).

The thickness of the dielectric film 40 is preferably 30 nm to 1000 nm (more preferably, 30 nm to 600 nm).

Incidentally, the thickness of the dielectric film 40 can be measured by processing a thin film capacitor including the dielectric film 40 with a focused ion beam (FIB) processing device and observing the obtained cross section with a scanning electron microscope (SEM).
(1.2.1 Complex Oxide)
The above-mentioned complex oxide is an oxide containing strontium (Sr), calcium (Ca), and titanium (Ti). In the present embodiment, the complex oxide is represented by a general formula of $(Sr_{1-x}Ca_x)_yTiO_3$ and has a perovskite structure.

In the general formula, "x" is a molar ratio of calcium to the total molar number (1.00) of strontium and calcium, and "y" is a ratio of the total molar number of strontium and calcium to the molar number of titanium.

In the present embodiment, relations of $0.40 \leq x \leq 0.90$ and $0.90 \leq y \leq 1.10$ are satisfied.

If "x" is too small, the leakage current tends to increase. On the other hand, if "x" is too large, the permittivity tends to be decrease.

If "y" is too small, the leakage current tends to increase. On the other hand, if "y" is too large, the leakage current tends to increase.

Preferably, "x" is 0.65 or more (more preferably, 0.75 or more). On the other hand, preferably, "x" is 0.88 or less (more preferably, 0.85 or less).

Preferably, "y" is 0.92 or more (more preferably, 0.96 or more). On the other hand, preferably, "y" is 1.08 or less (more preferably, 1.06 or less).

The dielectric film according to the present embodiment has a preferred orientation plane. The preferred orientation plane is obtained by forming a dielectric film using a known film formation method. On the other hand, a sintered body obtained by firing a pressed body of a raw material powder of dielectric substance (i.e., obtained by solid-phase reaction) does not have the following structure due to preferred orientation plane.

In the present embodiment, a relation of $I_{(112)}/I_{(004)} \geq 3.00$ is satisfied, where $I_{(112)}$ is a diffraction peak intensity of (1, 1, 2) plane of the complex oxide, and $I_{(004)}$ is a diffraction peak intensity of (0, 0, 4) plane of the complex oxide, in an X-ray diffraction chart obtained by an X-ray diffraction measurement of the dielectric film.

The relative permittivity of the dielectric film is improved by controlling a preferred orientation plane of the dielectric film so that $I_{(112)}$ and $I_{(004)}$ satisfy the above-mentioned relation.

Preferably, $I_{(112)}/I_{(004)}$ is 5.00 or more (more preferably, 6.00 or more). In addition to improving the relative permittivity, the dielectric loss of the dielectric film can be reduced. There is no upper limit to $I_{(112)}/I_{(004)}$.

Furthermore, in the present embodiment, a relation of $I_1/I_2 \geq 3.00$ is satisfied, where $I_1$ is an intensity of a diffraction peak appearing at a diffraction angle 2θ of 32° or more and 34° or less, and $I_2$ is an intensity of a diffraction peak appearing at a diffraction angle 2θ of 46° or more and 48° or less, among diffraction peaks belonging to the complex oxide in an X-ray diffraction chart of the dielectric film obtained by the X-ray diffraction measurement with Cu-Kα ray as an X-ray source.

The relative permittivity of the dielectric film is improved by controlling a crystal orientation of the dielectric film so that $I_1$ and $I_2$ satisfy the above-mentioned relation.

Preferably, $I_1/I_2$ is 5.00 or more (more preferably, 6.00 or more). In addition to improving the relative permittivity, the dielectric loss of the dielectric film can be reduced.

In general, $I_{(112)}$ corresponds to $I_1$, and $I_{(004)}$ corresponds to $I_2$. The dielectric film according to the present embodiment may satisfy both of the relation of $I_{(112)}/I_{(004)}$ and the relation of $I_1/I_2$ or may satisfy only the relation of $I_{(112)}/I_{(004)}$ or the relation of $I_1/I_2$.

The crystal orientation of the dielectric film can be controlled by any known method, such as type of film formation method, substrate temperature during film formation, energy given during film formation, and atmosphere during film formation.

In addition to the above-mentioned main component, from the viewpoint of reduction in dielectric loss, the dielectric film according to the present embodiment preferably contains a subcomponent selected from at least one of manganese oxide (MnO), vanadium oxide ($V_2O_5$), aluminum oxide ($Al_2O_3$), and niobium oxide ($Nb_2O_5$). In particular, the dielectric film according to the present embodiment preferably contains manganese oxide and vanadium oxide.

When the dielectric film according to the present embodiment contains manganese oxide and vanadium oxide, preferably, the content ratio of manganese oxide is 0.010 mol % or more and 2.000 mol % or less, and the content ratio of vanadium oxide is 0.050 mol % or more and 3.000 mol % or less, with respect to 100 mol % of the main component.

Incidentally, the dielectric film according to the present embodiment may contain a trace amount of impurities other than the above-mentioned subcomponent within a range in which the effects of the present invention are exhibited.

(1.3. Substrate)

The substrate 10 shown in FIG. 1 is made of any material that is chemically and thermally stable, generates little stress, and can maintain surface smoothness, such as a single crystal substrate composed of Si single crystal, sapphire single crystal, $SrTiO_3$ single crystal, MgO single crystal, etc.; a ceramic polycrystalline substrate composed of alumina ($Al_2O_3$), magnesia (MgO), forsterite ($2MgO.SiO_2$), steatite ($MgO.SiO_2$), mullite ($3Al_2O_3.2SiO_2$), beryllia (BeO), zirconia ($ZrO_2$), aluminum nitride (AlN), silicon nitride ($Si_3N_4$), silicon carbide (SiC), etc.; a glass-ceramic substrate (LTCC substrate) composed of alumina (crystal phase), silicon oxide (glass phase), etc. obtained by firing at 1000° C. or less; a glass substrate (e.g., quartz glass); and a metal substrate composed of Fe—Ni alloy or the like. The substrate 10 shown in FIG. 1 may be a metal foil made of nickel (Ni) or copper (Cu). Such a metal foil can also function as a lower electrode mentioned below, which makes it easy to mount the thin film capacitor on an electronic circuit board. By using these, it is thereby possible to contribute to further thinning of the thin film capacitor and to reduction of the substrate cost. In the present embodiment, a Si single crystal having a good surface smoothness is used as the substrate.

The thickness of the substrate 10 is set to, for example, 10 µm to 5000 µm. Using the metal foil can contribute to further thinning and flexibility.

The substrate 10 has a different resistivity depending on the material of the substrate. When the substrate is made of a material having a low resistivity, electrical characteristics of the thin film capacitor may be affected by leakage of electric current to the substrate side during operation of the thin film capacitor. Thus, when the substrate 10 has a low resistivity, the surface of the substrate 10 is preferably subjected to an insulation treatment so as to prevent electric current during capacitor operation from flowing to the substrate 10.

For example, when Si single crystal is used as the substrate 10, an insulation layer 20 is preferably formed on the surface of the substrate 10. The insulation layer 20 can be made of any material and have any thickness as long as the substrate 10 and the capacitor part 60 are sufficiently insulated. In the present embodiment, the insulation layer 20 is made of $SiO_2$, $Al_2O_3$, $Si_3N_x$, etc. Preferably, the insulation layer has a thickness of 0.01 µm or more.

(1.4 First Electrode)

As shown in FIG. 1, a lower electrode 30 is thinly formed on the substrate 10 via the insulation layer 20. Along with an upper electrode 50 mentioned below, the lower electrode 30 sandwiches the dielectric film 40 and is an electrode that functions as a capacitor. The lower electrode 30 is made of any conductive material, such as a metal of Au, Pt, Ag, Ir, Ru, Co, Ni, Fe, Cu, Al, etc. or their alloy; a semiconductor of Si, GaAs, GaP, InP, SiC, etc.; and a conductive metal oxide of ITO, ZnO, $SnO_2$ etc.

The first electrode 30 has any thickness as long as the first electrode 30 functions as an electrode. In the present embodiment, the first electrode 30 preferably has a thickness of 0.01 µm or more.

Incidentally, an adhesive layer may be formed on the substrate before the thin film is formed on the substrate so as to improve the adhesion between the substrate and thin film. The adhesive layer is made of any material that improves the adhesion between the substrate and the thin film. In the present embodiment, for example, the adhesive layer is titanium oxide, chromium oxide, or the like.

(1.5. Second Electrode)

As shown in FIG. 1, an upper electrode 50 is thinly formed on the surface of the dielectric film 40. Along with the lower electrode 30 mentioned above, the upper electrode 50 sandwiches the dielectric film 40 and is an electrode that functions as a capacitor. Thus, the polarity of the second electrode 50 is different from that of the first electrode 30.

As with the first electrode 30, the second electrode 50 is made of any conductive material, such as a metal of Au, Pt, Ag, Ir, Ru, Co, Ni, Fe, Cu, Al, etc. or their alloy; a semiconductor of Si, GaAs, GaP, InP, SiC, etc.; and a conductive metal oxide of ITO, ZnO, $SnO_2$ etc.

As with the first electrode 30, the second electrode 50 has any thickness as long as the second electrode 50 functions as an electrode. In the present embodiment, the second electrode 50 preferably has a thickness of 0.01 µm or more.

2. Method of Manufacturing Thin Film Capacitor

Next, a method of manufacturing the thin film capacitor 100 shown in FIG. 1 is explained below.

First of all, the substrate 10 is prepared. For example, when a Si single crystal substrate is used as the substrate 10, the insulation layer 20 is formed on either of main surfaces of the substrate. The insulation layer 20 is formed by any known film formation method, such as thermal oxidation method and chemical vapor deposition (CVD) method.

Next, an adhesive layer is formed as necessary on the insulation layer by a known film formation method.

When the adhesive layer is formed, the first electrode 30 is formed on the adhesive layer by a known film formation method.

Next, the dielectric film 40 according to the present embodiment is formed on the first electrode 30. In the present embodiment, the dielectric film 40 is formed as a deposition film in which the material constituting the dielectric film 40 is thinly deposited on the first electrode 30.

For example, the known film formation method is a vacuum deposition method, a sputtering method, a pulsed laser deposition (PLD) method, a metal organic chemical vapor deposition (MO-CVD) method, a metal organic decomposition (MOD) method, sol-gel method, or a chemical solution deposition (CSD) method. In the present embodiment, from the viewpoint of control of crystal orientation, cost, etc., the known film formation method is preferably a sputtering method.

Incidentally, a trace amount of impurities, subcomponents, etc. may be contained in raw materials used during film formation (vapor deposition materials, various target materials, organometallic materials, etc.), but this is not a problem if desired dielectric characteristics are obtained.

In particular, the vapor phase growth method is more effective than the solution method for controlling the orientation of crystallites. For example, when a sputtering method is used, the dielectric film is formed on the first electrode using a target with a desired composition. In the present embodiment, the film formation conditions during sputtering are preferably as below. The substrate temperature is preferably higher and is preferably, for example, 650° C. or more and 1000° C. or less. The intensity ratio of diffraction peaks mentioned above can easily be in the above-mentioned range by appropriately combining such film formation conditions.

Next, the second electrode 50 is formed on the dielectric film 40 using a known film formation method.

In the present embodiment, an annealing treatment is preferably carried out after the second electrode 50 is formed. As conditions of the annealing treatment, for example, a reduction firing is carried out at an annealing temperature of 400-1000° C. The complex oxide can securely have a perovskite structure by carrying out the annealing treatment. The reduction firing means a firing under an atmosphere where an electrode is not oxidized. The atmosphere where an electrode is not oxidized means an atmosphere where an oxygen content is 1% or less, such as an atmosphere that can be created with a mixed gas of hydrogen, nitrogen, and steam and an atmosphere that can be created by utilizing the dissociation of oxygen from carbon monoxide and carbon dioxide. A vacuum atmosphere of 100 Pa or less may also be employed.

If necessary, a passivation layer (protective layer) may be formed. The passivation layer can be made of inorganic materials (e.g., $SiO_2$, $Al_2O_3$), organic materials (e.g., epoxy resin, polyimide resin), or the like.

Through the above-mentioned steps, as shown in FIG. 1, obtained is a thin film capacitor 100 where a capacitor part 60 (the first electrode 30, the dielectric film 40, and the second electrode 50) is formed on the substrate 10. Incidentally, the protective film 70 protecting the dielectric film 40 is formed by a known film formation method so as to cover at least a portion where the dielectric film 40 is exposed outside.

3. Electronic Circuit Board

The electronic circuit board according to the present embodiment is provided with the above-mentioned dielectric film. The electronic circuit board may be provided with an electronic component such as thin film capacitors including the above-mentioned dielectric films. The electronic component such as thin film capacitors may be placed on the surface of the electronic circuit board. The electronic component such as thin film capacitors may be embedded into the electronic circuit board. Preferably, the thin film capacitor included in the electronic circuit board has a metal foil as the substrate and the first electrode (lower electrode).

Figure 2A:
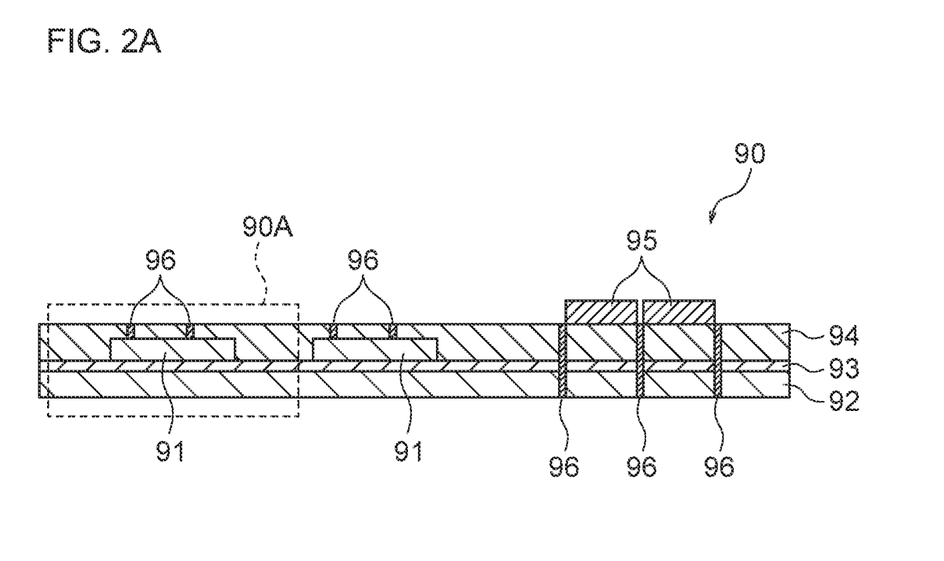
FIG. 2A is a schematic cross-sectional view of an electronic circuit board according to the present embodiment.
Figure 2B:
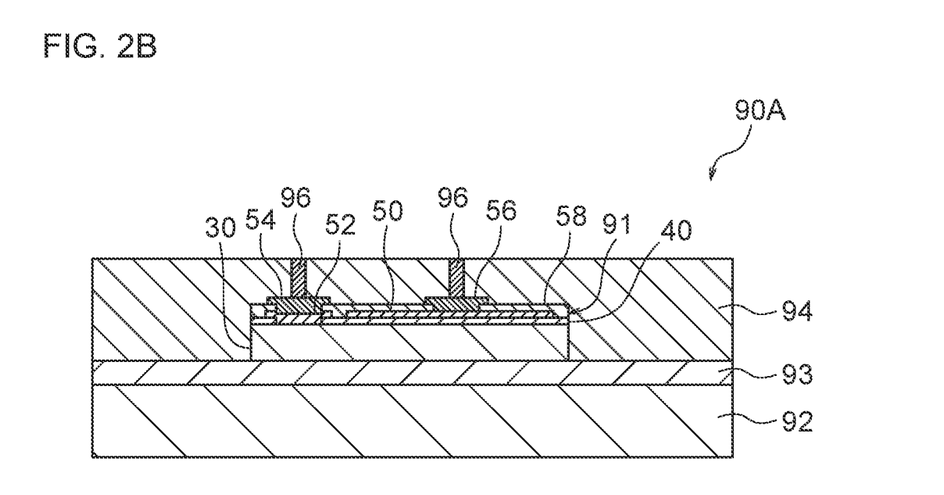
FIG. 2B is a schematic cross-sectional view of a thin film capacitor mounted on the electronic circuit board shown in FIG. 2A.

An example of the electronic circuit board is shown in FIG. 2A and FIG. 2B. An electronic circuit board 90 may include an epoxy based resin substrate 92, a resin layer 93 covering the epoxy based resin substrate 92, a thin film capacitor 91 placed on the resin layer 93, an insulating coverage layer 94 covering the resin layer 93 and the thin film capacitor 91, electronic components 95 placed on the insulating coverage layer 94, and a plurality of metal wires 96. At least some of the metal wires 96 may be led to the surface of the epoxy based resin substrate 92 or the insulating coverage layer 94. At least some of the metal wires 96 may be connected to an extraction electrode 54 (56) of the thin film capacitor 91 or to the electronic components 95. At least some of the metal wires 96 may go though the electronic circuit board 90 from the front surface to the rear surface of the electronic circuit board 90.

As shown in FIG. 2B, the thin film capacitor 91 according to the present embodiment may include the lower electrode 30, the dielectric film 40 placed on the surface of the lower electrode 30, the second electrode (upper electrode 50) placed on a part of the upper surface of the dielectric film 40, a through electrode 52 directly placed on the surface of the lower electrode 30 through another part of the dielectric film 40, an insulating resin layer 58 covering the upper electrode 50, the dielectric film 40, and the through electrode 52, the extraction electrode 54 directly placed on the surface of the through electrode 52 through the insulating resin layer 58, and the extraction electrode 56 directly placed on the surface of the upper electrode 50 through the insulating resin layer 58.

The electronic circuit board 90 can be manufactured in the following manner. First of all, the surface of the epoxy based resin substrate 92 is covered with an uncured resin layer. The uncured resin layer is a precursor of the resin layer 93. The thin film capacitor 91 is placed on the surface of the uncured resin layer so that a base electrode of the thin film capacitor 91 faces the uncured resin layer. The thin film capacitor 91 is sandwiched by the epoxy based resin substrate 92 and the insulating coverage layer 94 by covering the uncured resin layer and the thin film capacitor 91 with the insulating coverage layer 94. The resin layer 93 is formed by heat curing of the uncured resin layer. The insulating coverage layer 94 is bonded with the epoxy based resin substrate 92, the thin film capacitor 91, and the resin layer 93 by heat pressing. A plurality of through holes going through this multilayer board is formed. The metal wires 96 are formed inside the through holes. After the metal wires 96 are formed, the electronic components 95 are placed on the surface of the insulating coverage layer 94. The electronic circuit board 90 into which the thin film capacitor 91 is embedded is obtained in the above-mentioned manner. Each of the metal wires 96 may be made of a conductor of Cu or so. The uncured resin layer may be a B-stage thermosetting resin (e.g., epoxy resin). The B-stage thermosetting resin is not completely cured at room temperature and is completely cured by heating. The insulating coverage layer 94 may be formed from epoxy resin, polytetrafluoroethylene based resin, polyimide resin, or the like.

4. Summary of Present Embodiment

As a main component of the dielectric film obtained by film formation method, the present embodiment focuses on a complex oxide of strontium, calcium, and titanium.

A predetermined diffraction peak intensity ratio of the complex oxide satisfies a predetermined relation by controlling the crystal orientation of the dielectric film in addition to the composition optimization (the molar ratio between strontium and calcium and the molar ratio of the total of strontium and calcium to titanium are controlled to the above-mentioned range). As a result, it is possible to improve the relative permittivity of the dielectric film, reduce the leakage current density, and increase the allowable ripple current.

Moreover, when the dielectric film contains a predetermined oxide as a subcomponent, the dielectric loss can particularly be reduced. When the content ratio of the subcomponent oxide is in the above-mentioned range, the dielectric loss can further be reduced.

5. Modified Examples

In the above-mentioned embodiment, the dielectric element (thin film capacitor) having only the dielectric film according to the present embodiment is explained, but the dielectric element according to the present embodiment may have a multilayer structure where the dielectric film according to the present embodiment and another dielectric film are combined. For example, when the dielectric element according to the present embodiment has a multilayer structure with an existing amorphous dielectric film or crystal film of $Si_3N_x$, $SiO_x$, $Al_2O_x$, $ZrO_x$, $Ta_2O_x$, etc., it is possible to adjust the impedance of the dielectric film and the temperature change of the relative permittivity.

The dielectric element according to the present embodiment may be a multilayer capacitor having a structure where the dielectric film according to the present embodiment and an internal electrode layer are laminated.

In the above-mentioned embodiment, the thin film capacitor has the substrate, but may have no substrate. For example, the thin film capacitor may be formed by forming the dielectric film and the second electrode on a metal plate as the first electrode.

Hereinbefore, an embodiment of the present invention is explained, but the present invention is not limited to the above-mentioned embodiment and may variously be changed within the scope of the present invention.

EXAMPLES

Hereinafter, the present invention is explained in further detail with Examples and Comparative Examples. However, the present invention is not limited to Examples mentioned below.

(Experiment 1)

First of all, a target necessary for forming a dielectric film was manufactured as below.

As raw material powders of the target, each powder of strontium carbonate ($SrCO_3$), calcium carbonate ($CaCO_3$), and titanium oxide ($TiO_2$) was prepared. The powders were weighed so that the dielectric film would have the composition shown in Table 1.

The weighed raw material powders of the target were mixed in wet manner for 20 hours with a solvent of water in a ball mill. The mixed powder slurry was dried at 100° C. to obtain a mixed powder. The mixed powder was pressed by a press machine to obtain a pressed body. As the press conditions, the pressure was 100 Pa, the temperature was 25° C., and the press time was three minutes.

After that, the pressed body was fired to obtain a sintered body. As the firing conditions, the holding time was 1300-1400° C., the temperature holding time was two to five hours, and the atmosphere was the air.

The sintered body was processed so that the diameter would be 200 mm and the thickness would be 6 mm by surface grinder and cylindrical grinder. Then, a target for forming the dielectric film was obtained.

Next, a substrate was prepared. The substrate was a Si single crystal substrate where an oxidation film (insulation layer) was formed on the surface by thermal oxidation treatment. The size of the substrate was 5 mm×10 mm×1 mm. The film thickness of the insulation layer was 0.5 μm. A Pt thin film as a first electrode (thickness: 0.1 μm) was formed on the surface of the insulation layer by sputtering method.

Next, the dielectric film was formed on the first electrode by sputtering method using the above-manufactured target so that the thickness would be 200 nm.

As the film formation conditions, the substrate temperature was one shown in Table 1, and the film formation pressure was 0.1 Pa. To expose a part of the first electrode, a region where the dielectric film was not formed was formed using a metal mask.

Next, a Pt thin film as a second electrode was formed on the dielectric film by sputtering method. After the second electrode was formed, a reduction firing was carried out at the temperature shown in Table 1 (annealing temperature), and samples of a thin film capacitor having the structure shown in FIG. 1 (Sample No. 1-15) were obtained.

Incidentally, it was confirmed that the composition of the dielectric film of each of the samples was analyzed using X-ray fluorescence elemental analysis (XRF) and corresponded with the composition shown in Table 1. The thickness of the dielectric film was a measured value obtained by processing the thin film capacitor with FIB and observing this cross section with scanning electron microscope (SEM).

The relative permittivity, dielectric loss (tan δ), and leakage current density of each of the thin film capacitor samples were measured in the following manner. In addition, the XRD measurement of the dielectric film was carried out in the following manner.

The relative permittivity of the thin film capacitor samples was calculated from the capacitance measured with an impedance analyzer (E4980A) at a room temperature of 25° C. and a measurement frequency of 100 kHz (1 Vrms) and the electrode dimensions and the distance between the electrodes of the thin film capacitor samples. A relative permittivity of 180 or more was preferable. The results are shown in Table 1.

The dielectric loss (tan δ) of the thin film capacitor samples was measured at 100 kHz using an impedance analyzer (E4980A). A dielectric loss of 3.0% or less was preferable. The results are shown in Table 1.

The leakage current density of the thin film capacitor samples was measured at a room temperature of 25° C. and an electric field strength of 800 kV/cm using a semiconductor parameter analyzer (Agilent 4339B). In the present examples, a leakage current density of 200 $A/mm^2 \times 10^{-8}$ or less was preferable. The results are shown in Table 1.

(XRD Measurement)

The dielectric film was subjected to an XRD measurement to obtain an X-ray diffraction chart. In the X-ray diffraction chart, $I_{(112)}/I_{(004)}$ was obtained by calculating a diffraction peak intensity $I_{(112)}$ on (1, 1, 2) plane and a diffraction peak intensity $I_{(004)}$ on (0, 0, 4) plane of a complex oxide having a perovskite structure. The results are shown in Table 1.

In addition, $I_1/I_2$ was obtained by calculating a diffraction peak intensity $I_1$ at a diffraction angle 2θ of 32°-34° and a diffraction peak intensity $I_2$ at a diffraction angle 2θ of 46°-48°. The results are shown in Table 1.

In the XRD measurement, Cu-Kα ray was used as an X-ray source, and the measurement conditions were 45 kV (voltage) and 2θ=20°-90°.

The thin film capacitor shown in FIG. 2B was manufactured to measure an allowable ripple current in the following manner. The AC voltage generated by a function generator was amplified 20 times with an amplifier and applied to the thin film capacitor while monitoring the temperature of the thin film capacitor using a thermometer. The current values of the AC voltage passed through the thin film capacitor were measured with an oscilloscope, and the current value at a time when the temperature of the thin film capacitor rose by 20° C. before the application of the AC voltage was defined as the allowable ripple current. In the present examples, preferably, the allowable ripple current was 300 mA or more. The results are shown in Table 1.

TABLE 1

| Sample No. | Dielectric Film | | | | | | | Characteristics | | | |
|---|---|---|---|---|---|---|---|---|---|---|---|
| | Substrate | | | | | | | | | | |
| | $(Sr_{1-x}Ca_x)_yTiO_3$ | | Temperature During Film Formation (°C.) | Annealing Temperature (°C.) | $I_{(112)}/I_{(004)}$ | $I_1/I_2$ | Film Thickness (nm) | Relative Permittivity | tanδ (%) | Leakage Current Density at Application of 16 V $(A/mm^2 \times 10^{-8})$ | Allowable Ripple Current at Heat Generation of 20° C. (mA) |
| | x | y | | | | | | | | | |
| 1 | 0.72 | 0.92 | 750 | 900 | 5.10 | 5.10 | 200 | 204 | 1.0 | 132 | 510 |
| 2 | 0.40 | 1.00 | 700 | 750 | 8.89 | 8.89 | 200 | 266 | 1.1 | 89.5 | 537 |
| 3 | 0.40 | 1.10 | 700 | 800 | 6.23 | 6.23 | 200 | 201 | 0.9 | 0.8 | 544 |
| 4 | 0.72 | 1.10 | 650 | 850 | 4.11 | 4.11 | 200 | 186 | 2.9 | 140 | 430 |
| 5 | 0.60 | 1.10 | 750 | 850 | 6.72 | 6.72 | 200 | 215 | 1.2 | 0.09 | 570 |
| 6 | 0.84 | 1.00 | 650 | 900 | 5.23 | 5.23 | 200 | 220 | 0.6 | 170 | 332 |
| 7 | 0.84 | 1.06 | 500 | 750 | 1.64 | 1.64 | 200 | 151 | 1.7 | 19200 | 256 |
| 8 | 0.84 | 1.06 | 650 | 750 | 3.38 | 3.38 | 200 | 218 | 2.2 | 136 | 304 |
| 9 | 0.84 | 1.06 | 700 | 750 | 6.00 | 6.00 | 200 | 218 | 0.6 | 0.5 | 610 |
| 10 | 0.84 | 1.06 | 800 | 750 | 8.50 | 8.50 | 200 | 214 | 0.7 | 1.6 | 582 |
| 11 | 0.84 | 1.11 | 750 | 750 | 5.81 | 5.81 | 200 | 111 | 3.6 | 579 | 270 |
| 12 | 0.40 | 0.89 | 800 | 800 | 7.20 | 7.20 | 200 | 219 | 2.5 | 756 | 312 |
| 13 | 0.38 | 1.06 | 750 | 850 | 5.66 | 5.66 | 200 | 280 | 3.1 | 350 | 254 |
| 14 | 0.92 | 1.06 | 650 | 750 | 4.10 | 4.10 | 200 | 157 | 0.7 | 10.4 | 570 |
| 15 | 0.40 | 1.00 | 300 | 750 | 2.12 | 2.12 | 200 | 164 | 3.3 | 1270 | 266 |

According to Table 1, it was confirmed that samples whose relations of "x" and "y" were in the above-mentioned ranges and whose predetermined diffraction peak intensity ratio satisfied the above-mentioned relation had a high relative permittivity, a low dielectric loss, a small leakage current density, and a large allowable ripple current.

On the other hand, it was confirmed that samples whose relations of "x" and "y" were out the above-mentioned ranges had a low relative permittivity and a high dielectric loss. It was also confirmed that even if the relations of "x" and "y" were in the above-mentioned ranges, the leakage current density was large when the predetermined diffraction peak intensity ratio did not satisfy the above-mentioned relation.

(Experiment 2)

Except for manufacturing a target by weighing raw material powders of the target so that dielectric films would have the composition shown in Table 2 and setting the substrate temperature during film formation and the annealing temperature after film formation to those shown in Table 2, thin film capacitor samples were manufactured in the same manner as Experiment 1. The manufactured thin film capacitor samples were subjected to the same evaluation as Experiment 1. The results are shown in Table 2.

TABLE 2

| Sample No. | Dielectric Film | | | | | | | Characteristics | | | |
|---|---|---|---|---|---|---|---|---|---|---|---|
| | Substrate | | | | | | | | | | |
| | $(Sr_{1-x}Ca_x)_yTiO_3$ | | Temperature During Film Formation (°C.) | Annealing Temperature (°C.) | $I_{(112)}/I_{(004)}$ | $I_1/I_2$ | Film Thickness (nm) | Relative Permittivity | tanδ (%) | Leakage Current Density at Application of 16 V $(A/mm^2 \times 10^{-8})$ | Allowable Ripple Current at Heat Generation of 20° C. (mA) |
| | x | y | | | | | | | | | |
| 16 | 0.72 | 0.91 | 650 | 800 | 3.22 | 3.22 | 200 | 189 | 2.1 | 133 | 354 |
| 17 | | | 700 | 900 | 5.75 | 5.75 | 200 | 194 | 1.0 | 51.2 | 348 |
| 18 | | 0.90 | 800 | 800 | 6.21 | 6.21 | 200 | 212 | 1.1 | 11.4 | 520 |
| 19 | | | 800 | 800 | 7.01 | 7.01 | 200 | 223 | 0.9 | 43.2 | 538 |
| 20 | 0.50 | 1.06 | 750 | 750 | 4.52 | 4.52 | 200 | 245 | 0.7 | 167 | 365 |
| 21 | | | 800 | 800 | 5.76 | 5.76 | 200 | 255 | 0.3 | 183 | 324 |

According to Table 2, it was confirmed that when the relations of "x" and "y" were in the above-mentioned ranges, the relative permittivity was high, the dielectric loss was low, the leakage current density was small, and the allowable ripple current was large.

(Experiment 3)

As raw material powders of a target, each powder of manganese oxide (MnO), vanadium oxide ($V_2O_5$), aluminum oxide ($Al_2O_3$), and niobium oxide ($Nb_2O_5$) were prepared. These powders would be contained as subcomponents of dielectric films. Except for manufacturing a target by weighing the raw material powders of the target so that the dielectric films would have the composition shown in Table 3 and setting the substrate temperature during film formation and the annealing temperature after film formation to those shown in Table 3, thin film capacitor samples were manufactured in the same manner as Experiment 1. The manufactured thin film capacitor samples were subjected to the same evaluation as Experiment 1. The results are shown in Table 3.

TABLE 3

| | Dielectric Film | | | | | | | | | Characteristics | | | | |
|---|---|---|---|---|---|---|---|---|---|---|---|---|---|---|
| | | | Sub Component | | Substrate Temperature | Annealing | | | Film | | | | Leakage Current Density at | Allowable Ripple Current at Heat |
| Sample No. | $(Sr_{1-x}Ca_x)_yTiO_3$ | | Kind | Content Ratio | During Film Formation | Temperature | $I_{(112)}/$ | $I_1/$ | Thickness | Relative Permittivity | tanδ | Application of 16 V | Generation of 20° C. |
| | x | y | | (mol %) | (° C.) | (° C.) | $I_{(004)}$ | $I_2$ | (nm) | | (%) | (A/mm² × 10⁻⁸) | (mA) |
| 22 | 0.84 | 1.06 | MnO | 1.00 | 750 | 750 | 6.52 | 6.52 | 200 | 224 | 0.7 | 1.2 | 521 |
| 23 | 0.84 | 1.06 | MnO | 1.80 | 750 | 850 | 5.64 | 5.64 | 200 | 210 | 2.3 | 3.2 | 480 |
| 24 | 0.84 | 1.06 | $V_2O_5$ | 0.10 | 700 | 800 | 5.82 | 5.82 | 200 | 243 | 0.6 | 4.1 | 620 |
| 25 | 0.84 | 1.06 | $V_2O_5$ | 3.00 | 650 | 800 | 4.16 | 4.16 | 200 | 181 | 2.6 | 0.7 | 377 |
| 26 | 0.84 | 1.06 | $Al_2O_3$ | 0.20 | 650 | 825 | 5.64 | 5.64 | 200 | 196 | 0.8 | 3.3 | 456 |
| 27 | 0.84 | 1.06 | $Nb_2O_5$ | 2.00 | 800 | 700 | 7.76 | 7.76 | 200 | 186 | 0.8 | 5.8 | 429 |
| 28 | 0.84 | 1.06 | MnO + $V_2O_5$ | (MnO) 2.00 ($V_2O_5$) 1.00 | 750 | 800 | 6.11 | 6.11 | 200 | 228 | 0.07 | 0.07 | 600 |

According to Table 3, it was confirmed that characteristics were further improved by containing the above-mentioned components as subcomponents of the dielectric films.

INDUSTRIAL APPLICABILITY

The present invention can obtain a dielectric film with high relative permittivity, low leakage current density, and high allowable ripple current. A dielectric element having such a thin dielectric film is small in size and high in performance and is thus suitable for an electronic component mounted on an electronic circuit board.

DESCRIPTION OF THE REFERENCE NUMERICAL

100 . . . thin film capacitor
10 . . . substrate
30 . . . first electrode
40 . . . dielectric film
50 . . . second electrode
90 . . . electronic circuit board
91 . . . thin film capacitor
30 . . . lower electrode
40 . . . dielectric film
50 . . . upper electrode
92 . . . epoxy based resin substrate
93 . . . resin layer
94 . . . insulating coverage layer
95 . . . electronic component
96 . . . metal wire

What is claimed is:

1. A dielectric film comprising a main component of a complex oxide represented by a general formula of $(Sr_{1-x}Ca_x)_yTiO_3$, wherein
   0.40≤x≤0.90 and 0.90≤y≤1.10 are satisfied, and
   a ratio of a diffraction peak intensity on (1, 1, 2) plane of the complex oxide to a diffraction peak intensity on (0, 0, 4) plane of the complex oxide in an X-ray diffraction chart of the dielectric film is 3.00 or more.

2. The dielectric film according to claim 1, wherein the ratio of the diffraction peak intensity on (1, 1, 2) plane of the complex oxide to the diffraction peak intensity on (0, 0, 4) plane of the complex oxide is 5.00 or more.

3. A dielectric film comprising a main component of a complex oxide represented by a general formula of $(Sr_{1-x}Ca_x)_yTiO_3$, wherein
   0.40≤x≤0.90 and 0.90≤y≤1.10 are satisfied, and
   a ratio of an intensity of a diffraction peak appearing at a diffraction angle 2θ of 32° or more and 34° or less to an intensity of a diffraction peak appearing at a diffraction angle 2θ of 46° or more and 48° or less in an X-ray diffraction chart of the dielectric film obtained by an X-ray diffraction measurement with Cu-Kα ray as an X-ray source is 3.00 or more.

4. The dielectric film according to claim 3, wherein the ratio of the intensity of the diffraction peak appearing at the diffraction angle 2θ of 32° or more and 34° or less to the intensity of the diffraction peak appearing at the diffraction angle 2θ of 46° or more and 48° or less is 5.00 or more.

5. The dielectric film according to claim 1, further comprising at least one selected from the group of consisting of MnO, $V_2O_5$, $Al_2O_3$, and $Nb_2O_5$ as a subcomponent.

6. The dielectric film according to claim 3, further comprising at least one selected from the group of consisting of MnO, $V_2O_5$, $Al_2O_3$, and $Nb_2O_5$ as a subcomponent.

7. The dielectric film according to claim 5, comprising MnO, wherein an amount of MnO with respect to 100 mol of the complex oxide is 0.010 mol or more and 2.000 mol or less.

8. The dielectric film according to claim 6, comprising MnO, wherein an amount of MnO with respect to 100 mol of the complex oxide is 0.010 mol or more and 2.000 mol or less.

9. The dielectric film according to claim 5, comprising $V_2O_5$, wherein an amount of $V_2O_5$ with respect to 100 mol of the complex oxide is 0.050 mol or more and 3.000 mol or less.

10. The dielectric film according to claim 6, comprising $V_2O_5$, wherein an amount of $V_2O_5$ with respect to 100 mol of the complex oxide is 0.050 mol or more and 3.000 mol or less.

11. A dielectric element comprising the dielectric film according to claim 1 and an electrode.

12. A dielectric element comprising the dielectric film according to claim 3 and an electrode.

13. An electronic circuit board comprising the dielectric element according to claim 11.

14. An electronic circuit board comprising the dielectric element according to claim 12.

\* \* \* \* \*